(12) United States Patent
Chang

(10) Patent No.: US 12,557,687 B2
(45) Date of Patent: Feb. 17, 2026

(54) SEMICONDUCTOR PACKAGE DEVICE AND METHOD FOR MANUFACTURING THE SAME

(71) Applicant: TAIWAN SEMICONDUCTOR MANUFACTURING COMPANY, LTD., Hsinchu (TW)

(72) Inventor: Jen-Yuan Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 442 days.

(21) Appl. No.: 18/330,226

(22) Filed: Jun. 6, 2023

(65) Prior Publication Data

US 2024/0413108 A1 Dec. 12, 2024

(51) Int. Cl.
  *H01L 23/48* (2006.01)
  *H01L 23/00* (2006.01)
  *H01L 23/52* (2006.01)
  *H01L 29/40* (2006.01)

(52) U.S. Cl.
  CPC .............. *H01L 24/08* (2013.01); *H01L 24/80* (2013.01); *H01L 2224/08146* (2013.01); *H01L 2224/80895* (2013.01); *H01L 2224/80896* (2013.01)

(58) Field of Classification Search
  CPC ...................... H01L 24/08; H01L 24/80; H01L 2224/08146; H01L 2224/80895; H01L 2224/80896; H10H 20/8162; H10H 20/831; H10H 20/832; H10H 20/833; H10H 20/01; H10H 20/814; H10H 20/816; H10H 20/825; H10H 20/857
  See application file for complete search history.

(56) References Cited

FOREIGN PATENT DOCUMENTS

| CN | 108140559 A | * | 6/2018 | ............ H01L 24/08 |
| TW | 202220133 A | * | 5/2022 | |
| TW | 202245089 A | | 11/2022 | |

OTHER PUBLICATIONS

Taiwanese Search Report for Taiwanese Application No. 112146921, dated May 31, 2024, with English translation.

* cited by examiner

*Primary Examiner* — Niki H Nguyen
(74) *Attorney, Agent, or Firm* — Birch, Stewart, Kolasch & Birch, LLP

(57) ABSTRACT

A semiconductor package device includes a first semiconductor structure, a second semiconductor structure, and a non-metal dopant. The first semiconductor structure includes a first dielectric bonding layer and a first conductive bonding feature disposed in the first dielectric bonding layer. The second semiconductor structure includes a second dielectric bonding layer bonded to the first dielectric bonding layer and a second conductive bonding feature disposed in the second dielectric bonding layer. The first conductive bonding feature is bonded to the second conductive bonding feature to form an interface therebetween. The non-metal dopant is disposed in at least one of the first conductive bonding feature and the second conductive bonding feature.

20 Claims, 6 Drawing Sheets

SEMICONDUCTOR PACKAGE DEVICE AND METHOD FOR MANUFACTURING THE SAME

BACKGROUND

With rapid growth of semiconductor packaging technology, various methods have been developed to bond two semiconductor chips or dies together. Hybrid bonding is a common method for bonding two semiconductor dies together in a small outline integrated circuit (SoIC). Currently, in the hybrid bonding of the semiconductor dies in the SoIC, there exists some defects (e.g., voids) at a bonding interface between the semiconductor dies, which may adversely affect electrical performance of the SoIC. Therefore, there is a need to avoid formation of these defects at the bonding interface between the semiconductor dies of the SoIC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
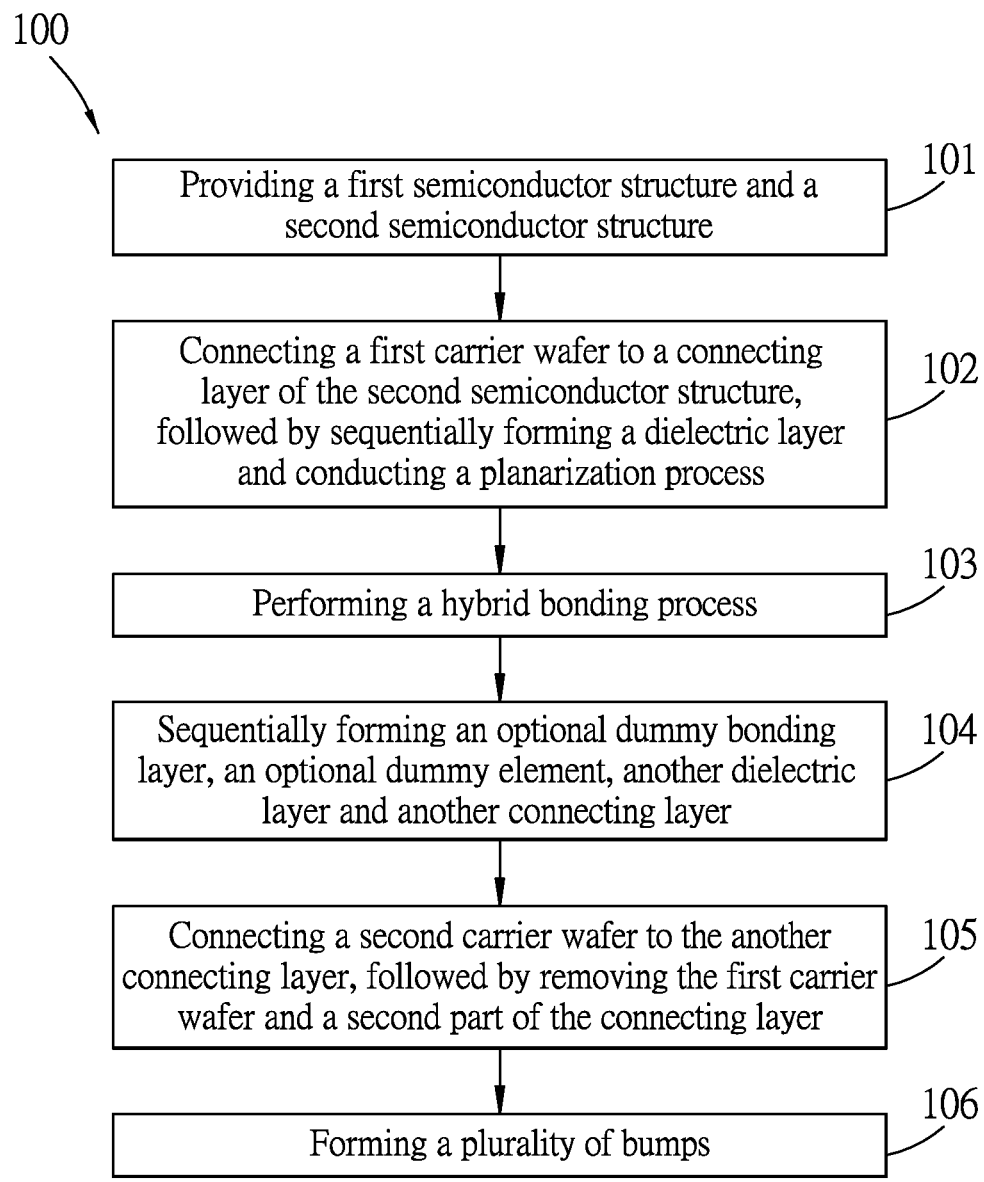
FIG. 1 is a flow diagram illustrating a method for manufacturing a semiconductor package device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be noted that the element(s) or feature(s) are exaggeratedly shown in the figures for the purpose of convenient illustration and are not in scale.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

Hybrid bonding is a common method for bonding two semiconductor dies together in a small outline integrated circuit (SoIC). Currently, when the SoIC is subjected to a device performance test (e.g., a reliability test), a current may pass through a bonding interface between two bond pad metals (BPMs), which may be made of a conductive metal (for example, but not limited to, copper (Cu)), of the two semiconductor dies in the SoIC, resulting in a metal migration, such as a copper migration (e.g., copper electromigration (EM)) at the bonding interface. In this case, some defects (e.g., voids) may be formed at the interface between the BPMs due to the metal migration, and may adversely affect electrical characteristics (e.g., an increased resistance value) or reliability of the SoIC. Formation of these defects may be caused by a metal loss (for example, a copper loss) induced during at least one cleaning process performed on the BPMs or by a dishing effect induced during a planarization process (e.g., chemical mechanical polishing (CMP)) performed on the BPMs. Therefore, there is a continuous need to efficiently mitigate the metal migration at the bonding interface between the BPMs of the two semiconductor dies in the SoIC.

The present disclosure is directed to a semiconductor package device and a method for manufacturing the same. FIG. 1 is a flow diagram illustrating a method 100 for manufacturing a semiconductor package device 200 shown in FIG. 10 in accordance with some embodiments. FIGS. 2 to 10 illustrate schematic views of some intermediate stages of the method 100. Some portions may be omitted in FIGS. 2 to 10 for the sake of brevity. Additional steps can be provided before, after or during the method 100, and some of the steps described herein may be replaced by other steps or be eliminated.

Referring to FIG. 1 and the example illustrated in FIGS. 2 to 5, the method 100 includes step 101, where a first semiconductor structure 11' (see FIG. 3) and a second semiconductor structure 21' (see FIG. 5) are independently provided. The first semiconductor structure 11' is obtained from a first semiconductor workpiece 11 (see FIG. 2), and the second semiconductor structure 21' is obtained from a second semiconductor workpiece 21 (see FIG. 4). In some embodiments, each of the first semiconductor structure 11' and the second semiconductor structure 21' may be a semiconductor die, a semiconductor chip (e.g., a static random access memory (SRAM) device), or a semiconductor wafer.

Figure 2:
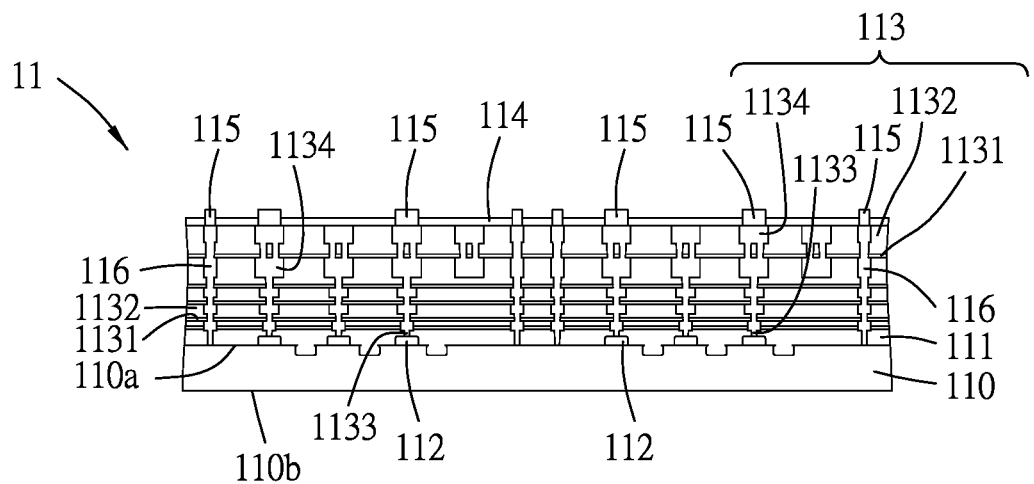
FIGS. 2 to 10 are schematic views illustrating some intermediate stages of the method as depicted in FIG. 1 in accordance with some embodiments.

As shown in FIG. 2, the first semiconductor workpiece 11 includes a first semiconductor substrate 110, a first interlayer dielectric (ILD) layer 111, a plurality of first semiconductor devices 112, a first interconnect structure 113, a first passivation layer 114, a plurality of first pads 115, and a plurality of first seal rings 116.

In some embodiments, the first semiconductor substrate 110 may include, but are not limited to, an elemental semiconductor or a compound semiconductor. The elemental semiconductor includes a single species of atoms, such as silicon (Si) or germanium (Ge) from column XIV of the periodic table, and may be crystalline, polycrystalline, or amorphous in structure. Other suitable materials for the elemental semiconductor are within the contemplated scope of the present disclosure. The compound semiconductor includes two or more elements, and examples thereof may include, but are not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials for the compound semiconductor are within the contemplated scope of the present disclosure. The compound semiconductor may have a gradient feature in which the compositional ratio thereof changes from one location to another location in the compound semiconductor. The compound semiconductor may be formed over a silicon substrate and may be strained. In some embodiments, the first semiconductor substrate 110 may include a multilayer compound semiconductor structure.

The first ILD layer 111 is disposed on an upper surface 110a of the first semiconductor substrate 110. The first ILD layer 111 may include, for example, but not limited to, phosphosilicate glass (PSG) or silicon oxide ($SiO_2$). Other suitable materials for the first ILD layer 111 are within the contemplated scope of the present disclosure.

The first semiconductor devices 112 are disposed on the first semiconductor substrate 110 and in the first ILD layer 111. Each of the first semiconductor devices 112 may include a gate structure (not shown), source/drain regions (not shown) and isolation structures (not shown) (e.g., shallow trench isolation (STI) structures). In some embodiments, the gate structure may include a gate dielectric and a gate electrode. In some embodiments, each of the first semiconductor devices 112 may be a transistor (e.g., a p-type metal-oxide-semiconductor field-effect transistor (PMOSFET) or an n-type metal-oxide-semiconductor field-effect transistor (NMOSFET)) or a memory device. Other suitable semiconductor devices (e.g., diodes, capacitors, resistors, central processing units (CPUs), or graphics processing units (GPUS)) are within the contemplated scope of the present disclosure.

The first interconnect structure 113 is disposed on the first ILD layer 111 opposite to the first semiconductor substrate 110. In some embodiments, the first interconnect structure 113 may include a plurality of first etch stop layers 1131, a plurality of first insulating layers 1132, a plurality of first contact plugs 1133, and a plurality of first conductive interconnects (such as, conductive features and vias) 1134. The first etch stop layers 1131 and the first insulating layers 1132 are alternately stacked on the first ILD layer 111. The first etch stop layers 1131 may include, for example, but not limited to, silicon nitride (SiN), silicon carbide (SiC), or a suitable dielectric material. The first insulating layers 1132 may include, for example, but not limited to, undoped silicate glass (USG), low dielectric constant (k) material, extremely low k material, or silicon oxide ($SiO_2$). Other suitable materials for each of the first etch stop layers 1131 and the first insulating layers 1132 are within the contemplated scope of the present disclosure. The first contact plugs 1133 are disposed in the first ILD layer 111 and are respectively connected to the first semiconductor devices 112. The first contact plugs 1133 may be made of a conductive material, for example, but not limited to, tungsten (W). The first conductive interconnects 1134 are disposed to penetrate through the first etch stop layers 1131 and the first insulating layers 1132, and each of the first conductive interconnects 1134 is connected to a corresponding one of the first contact plugs 1133. Each of the first conductive interconnects 1134 may be made of a conductive material, for example, but not limited to copper (Cu). Other suitable materials for the first conductive interconnects 1134 are within the contemplated scope of the present disclosure.

The first passivation layer 114 is disposed on the first interconnect structure 113 opposite to the first ILD layer 111. The first passivation layer 114 may include, for example, but not limited to, silicon nitride (SiN), USG, or silicon oxide ($SiO_2$). Other suitable materials for the first passivation layer 114 are within the contemplated scope of the present disclosure.

The first pads 115 penetrate the first passivation layer 114 and respectively terminate at upper surfaces of the first conductive interconnects 1134 that are distal from the first semiconductor substrate 110. The first pads 115 may be made of a metal (e.g., aluminum (Al)) or a metal alloy (e.g., aluminum copper (AlCu)). Other suitable materials for the first pads 115 are within the contemplated scope of the present disclosure.

The first seal rings 116 are disposed in the first interconnect structure 113 and the first ILD layer 111, and are spaced apart from each other. Each of the first seal rings 116 is electrically connected to a corresponding one of the first pads 115. The first seal rings 116 may include, for example, but not limited to, copper (Cu). Other suitable materials for the first seal rings 116 are within the contemplated scope of the present disclosure.

Figure 3:
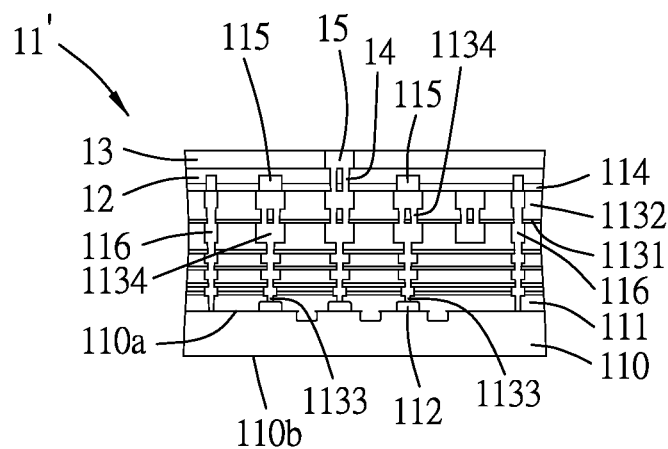

As shown in FIG. 3, a first dielectric layer 12, a first dielectric bonding layer 13, a plurality of first bonding vias 14, and a first conductive bonding feature 15 are sequentially formed on the first semiconductor workpiece 11 (see FIG. 2), followed by conducting a dicing process (e.g., a plasma dicing process or other suitable dicing processes), so as to obtain the first semiconductor structure 11'. The first dielectric layer 12 is formed on the first passivation layer 114 and the first pads 115 opposite to the first semiconductor substrate 110. The first dielectric layer 12 may include, for example, but not limited to, tetraethoxysilane (TEOS) or silicon oxide ($SiO_2$). Other suitable materials for the first dielectric layer 12 are within the contemplated scope of the present disclosure. The first dielectric bonding layer 13 is formed on the first dielectric layer 12 opposite to the first passivation layer 114. The first dielectric bonding layer 13 may include, for example, but not limited to, silicon oxide ($SiO_2$). Other suitable materials for the first dielectric bonding layer 13 are within the contemplated scope of the present disclosure. The first bonding vias 14 respectively fill two lower openings (not shown) that are formed by conducting a photolithography process to pattern the first dielectric bonding layer 13, the first dielectric layer 12 and the first passivation layer 114. The lower openings may penetrate through the first dielectric layer 12 and the first passivation layer 114, and may terminate at one of the upper surfaces of the first conductive interconnects 1134. The photolithography process may include an etching process that may be performed using, for example, but not limited to, an anisotropically etching process (e.g., dry etching or other suitable anisotropically etching processes). The first bonding vias 14 may be made of a conductive material, for example, but not limited to, copper (Cu). The first conductive bonding feature 15 fills an upper opening (not shown) that is formed during the photolithography process, that penetrates through the first dielectric bonding layer 13, and that is in spatial communication with the lower openings. The first conductive bonding feature 15 is connected to the first bonding vias 14. The first conductive bonding feature 15 may be made of a conductive material, for example, but not limited to, copper (Cu). Other suitable materials for the first conductive bonding feature 15 are within the contemplated scope of the present disclosure. In some embodiments, the first bonding vias 14 and the first conductive bonding feature 15 may be made of the same material and may be formed integrally with each other. In some embodiments, formation of the first bonding vias 14 and the first conductive bonding feature 15 may involve depositing a conductive material layer on the first dielectric bonding layer 13 and in the lower and upper openings, followed by conducting a planarization process (e.g., CMP or other suitable planarization processes) to remove an excess portion of the conductive material layer on the first dielectric bonding layer 13, so as to obtain the first bonding vias 14 and the first conductive bonding feature 15. In some embodiments, the first bonding vias 14 may be referred to as bond pad vias (BPVs). In some embodiments, the first conductive bonding feature 15 may be referred to as bond pad metal (BPM). In some embodiments, the first semiconductor structure 11' may be subjected to at least one cleaning process.

In some embodiments, after formation of the lower and upper openings and before formation of the first bonding vias 14 and the first conductive bonding feature 15, a first barrier layer (not shown) may be formed on two lower opening-defining walls that respectively define the lower openings, and an upper opening-defining wall that defines the upper opening. The first barrier layer may include, for example, but not limited to, titanium (Ti), titanium nitride (TiN), tantalum (Ta), or tantalum nitride (TaN). The first barrier layer may be used to mitigate metal migration, such as copper migration (which will be described hereinafter).

Figure 4:
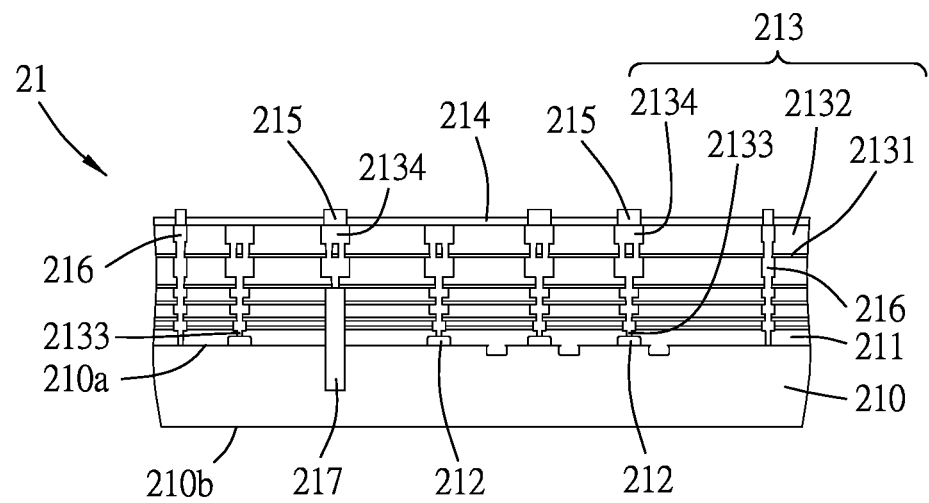

As shown in FIG. 4, the second semiconductor workpiece 21 is generally similar to the first semiconductor workpiece 11. The second semiconductor workpiece 21 includes a second semiconductor substrate 210, a second ILD layer 211, a plurality of second semiconductor devices 212, a second interconnect structure 213, a second passivation layer 214, a plurality of second pads 215 and a plurality of second seal rings 216, and further includes a through via 217. In some embodiments, the second interconnect structure 213 may include a plurality of second etch stop layers 2131, a plurality of second insulating layers 2132, a plurality of second contact plugs 2133, and a plurality of second conductive interconnects (such as, conductive features and vias) 2134. Each of the second contact plugs 2133 is connected to a corresponding one of the second conductive interconnects 2134. The respective materials of the second semiconductor substrate 210, the second ILD layer 211, the second semiconductor devices 212, the second etch stop layers 2131, the second insulating layers 2132, the second contact plugs 2133, the second conductive interconnects 2134, the second passivation layer 214, the second pads 215 and the second seal rings 216 are similar to those of the first semiconductor substrate 110, the first ILD layer 111, the first semiconductor devices 112, the first etch stop layers 1131, the first insulating layers 1132, the first contact plugs 1133, the first conductive interconnects 1134, the first passivation layer 114, the first pads 115 and the first seal rings 116, and therefore, details thereof are omitted for the sake of brevity.

The through via 217 is disposed in the second semiconductor substrate 210 and the second interconnect structure 213, and penetrates through the second ILD layer 211. In some embodiments, the through via 217 may be disposed between two adjacent ones of the second semiconductor devices 212. In some embodiments, the through via 217 may be made of a conductive material, for example, but not limited to, copper (Cu). Other suitable materials for the through via 217 are within the contemplated scope of the present disclosure. In some embodiments, the through via 217 may be divided into first and second parts, where the first part (may be referred to as through oxide via (TOV)) is disposed in the second interconnect structure 213 and penetrates through the second ILD layer 211, and the second part (may be referred to as through silicon via (TSV)) is disposed in the second semiconductor substrate 210. In this case, the first part of the through via 217 is electrically connected to a corresponding one of the second conductive interconnects 2134. It is noted that a number of the through via 217 may vary depending on practical needs.

Figure 5:
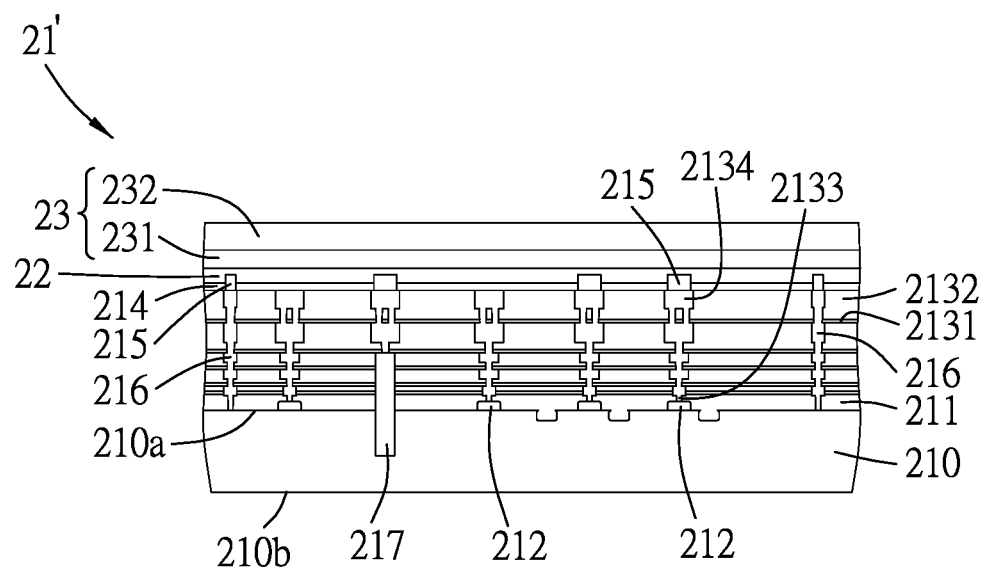

As shown in FIG. 5, a second dielectric layer 22 and a connecting layer 23 are sequentially formed on the second semiconductor workpiece 21 (see FIG. 4), followed by optionally conducting a dicing process (e.g., the plasma dicing process or other suitable dicing processes), so as to obtain the second semiconductor structure 21'. The material for the second dielectric layer 22 may be the same as or similar to that for the first dielectric layer 12, and thus details thereof are omitted for the sake of brevity. The connecting layer 23 may be made of an oxide-based material, for example, but not limited to, silicon oxide (SiO$_2$). Other suitable materials for the connecting layer 23 are within the contemplated scope of the present disclosure. In some embodiments, the connecting layer 23 may be formed as a multi-layered structure. In some embodiments, the connecting layer 23 may include a first part 231 disposed on the second dielectric layer 22, and a second part 232 disposed on the first part 231 opposite to the second dielectric layer 22.

Figure 6:
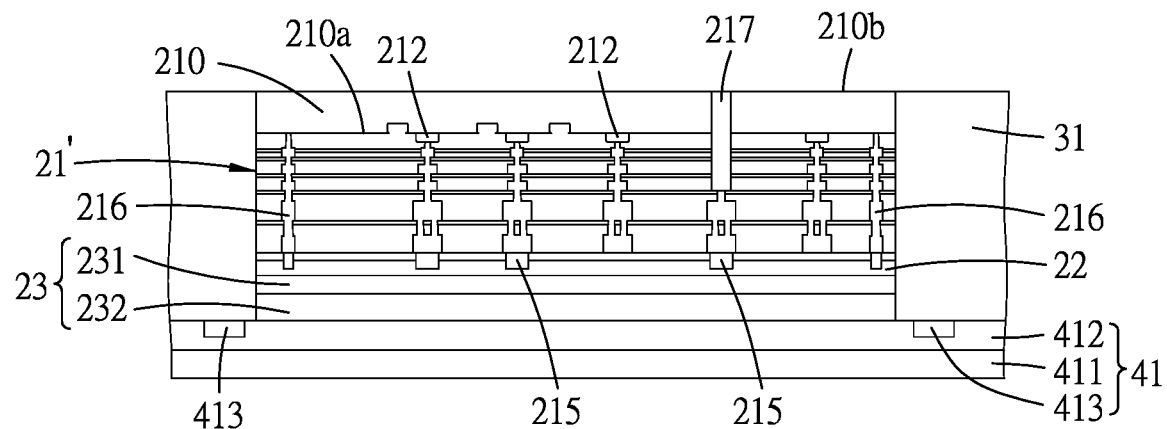

Referring to FIG. 1 and the example illustrated in FIG. 6, the method 100 then proceeds to step 102, where a first carrier wafer 41 is connected to the connecting layer 23 of the second semiconductor structure 21' through a fusion bonding method, followed by sequentially forming a third dielectric layer 31 on the second semiconductor structure 21' and the first carrier wafer 41, and conducting a planarization process. The first carrier wafer 41 may include a first base 411, a first fusion bonding layer 412 and a plurality of first alignment marks 413. The first base 411 may be made of silicon (Si). The first fusion bonding layer 412 is disposed on the first base 411. The first fusion bonding layer 412 may include, for example, but not limited to, silicon oxynitride (SiON) or silicon oxide (SiO$_2$). The first alignment marks 413 are disposed in the first fusion bonding layer 412 and are spaced apart from each other. The first alignment marks 413 may be made of a metal, such as copper (Cu). The first alignment marks 413 are used such that a precise connection between the second semiconductor structure 21' and the first carrier wafer 41 is established. The connecting layer 23 of the second semiconductor structure 21' is connected to the first fusion bonding layer 412 opposite to the first base 411. In some embodiments, the second semiconductor structure 21' may be located between two adjacent ones of the first alignment marks 413. The material for the third dielectric layer 31 may be the same as or similar to that for the first dielectric layer 12, and thus details thereof are omitted for the sake of brevity. After formation of the third dielectric layer 31, a planarization process (e.g., CMP or other suitable planarization processes) is conducted to remove portions of the third dielectric layer 31 and the second semiconductor substrate 210 in a direction from a lower surface 210b of the second semiconductor substrate 210 to an upper surface 210a of the second semiconductor substrate 210, until an upper surface of the through via 217 is exposed.

In some embodiments, the structure shown in FIG. 6, in which the second semiconductor structure 21' is included, may be provided directly.

Figure 7:
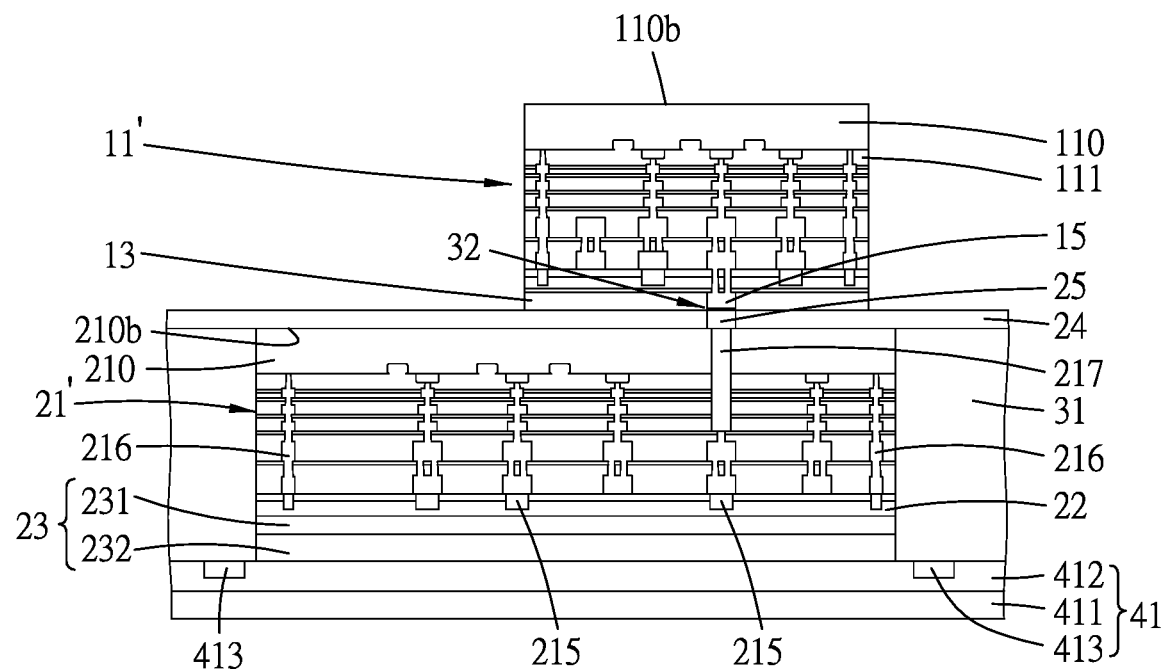

Referring to FIG. 1 and the example illustrated in FIG. 7, the method 100 then proceeds to step 103, where the structures shown in FIGS. 3 and 6 are bonded together (i.e., a hybrid bonding process). Step 103 may include sub-steps 1031 to 1035.

In sub-step 1031, a second dielectric bonding layer 24 is formed on the lower surface 210b of the second semiconductor substrate 210 of the structure shown in FIG. 6. The material for the second dielectric bonding layer 24 may be the same as or similar to that for the first dielectric bonding layer 13, and thus details thereof are omitted for the sake of brevity.

In sub-step 1032, the second dielectric bonding layer 24 is patterned by a photolithography process, which includes an etching process, so as to form an opening (not shown). The opening of the second dielectric bonding layer 24 may penetrate through the second dielectric bonding layer 24 and terminate at the upper surface of the through via 217.

In sub-step 1033, a second conductive bonding feature 25 is formed to fill the opening of the second dielectric bonding layer 24, and is formed on the upper surface of the through via 217. Sub-step 1033 may include depositing a conductive material layer on the second dielectric bonding layer 24 and in the opening of the second dielectric bonding layer 24, followed by conducting a planarization process (e.g., CMP or other suitable planarization processes) to remove an excess portion of the conductive material layer on the second dielectric bonding layer 24, so as to obtain the second conductive bonding feature 25. The material for the second conductive bonding feature 25 may be the same as or similar to that for the first conductive bonding feature 15, and thus details thereof are omitted for the sake of brevity. In some embodiments, the second conductive bonding feature 25 may be referred to as BPM.

In some embodiments, after patterning of the second dielectric bonding layer 24 (i.e., sub-step 1032) and before formation of the second conductive bonding feature 25 (i.e., sub-step 1033), a second barrier layer (not shown) may be formed on the upper surface of the through via 217. The material for the second barrier layer may be the same as or similar to that for the first barrier layer, and thus details thereof are omitted for the sake of brevity. After formation of the second barrier layer, the second conductive bonding feature 25 is formed on the second barrier layer. The second barrier layer may be used to mitigate metal migration, such as copper migration.

In sub-step 1034, a protective layer 32 is formed. In some embodiments, the protective layer 32 is formed by introducing a non-metal dopant into an upper portion of the first conductive bonding feature 15 exposed from the first dielectric bonding layer 13 or an upper portion of the second conductive bonding feature 25 exposed from the second dielectric bonding layer 24, so as to permit the first conductive bonding feature 15 or the second conductive bonding feature 25 to be doped with the non-metal dopant contained in the protective layer 32. In some embodiments, there are two of the protective layers 32, and the protective layers 32 are formed by introducing the non-metal dopant into the upper portion of the first conductive bonding feature 15 and the upper portion of the second conductive bonding feature 25, respectively, so as to permit the first conductive bonding feature 15 and the second conductive bonding feature 25 to be doped with the non-metal dopant contained in the protective layers 32. The protective layer(s) 32 is/are used to mitigate metal migration (such as, copper migration) at an interface between the first and second conductive bonding features 15, 25 (which will be described hereinafter).

In some embodiments, the non-metal dopant is oxygen, and the protective layer 32 thus formed is a metal oxide layer. In some embodiments, the protective layer 32 may be a copper oxide ($Cu_xO$) layer, such as a cuprous oxide ($Cu_2O$) layer or a cupric oxide (CuO) layer. In some embodiments, the $Cu_xO$ layer(s) may be formed by placing the first semiconductor structure 11' and/or the second semiconductor structure 21' in an oxygen-containing environment for a certain time period. For example, the first semiconductor structure 11' and/or the second semiconductor structure 21' may be placed in an oxygen-containing environment of a fabrication plant (fab) for at least 12 hours, so as to convert the upper portion(s) of the first semiconductor structure 11' and/or the second semiconductor structure 21' into the $Cu_xO$ layer(s). In this case, the $Cu_xO$ layer is formed naturally, thereby saving a manufacturing cost. If the time period is shorter than 12 hours, the $Cu_xO$ layer(s) may have a poor uniformity. In alternative embodiments, the upper portion(s) of the first conductive bonding feature 15 and/or the second conductive bonding feature 25 may be subjected to a gas plasma treatment with a source gas, such as oxygen ($O_2$) or ozone ($O_3$), so as to obtain the $Cu_xO$ layer(s). Other suitable plasma gases are within the contemplated scope of the present disclosure. In this case, the gas plasma treatment may facilitate formation of the $Cu_xO$ layer(s). In yet alternative embodiments, the upper portion(s) of the first conductive bonding feature 15 and/or the second conductive bonding feature 25 may be subjected to a thermal oxidation treatment with a source gas of oxygen ($O_2$). The uniformity of the $Cu_xO$ layer obtained by the gas plasma treatment or the thermal oxidation treatment is better than that of the $Cu_xO$ layer that is naturally formed in the oxygen-containing environment (e.g., the fab). In yet alternative embodiments, the $Cu_xO$ layer may be formed by an oxygen implanting treatment. In some embodiments, the $Cu_xO$ layer may have an oxygen concentration greater than about $10^{-6}$ parts per billion (ppb), such as greater than about 10 ppb. If the oxygen concentration of the $Cu_xO$ layer is lower than about $10^{-6}$ ppb, the $Cu_xO$ layer may not efficiently mitigate metal migration (such as, copper migration) at the interface between the first and second conductive bonding features 15, 25.

In some embodiments, the non-metal dopant is nitrogen and the protective layer 32 is a metal nitride layer. In some embodiments, the protective layer 32 may be a copper nitride ($Cu_xN$) layer. In some embodiments, the upper portion(s) of the first conductive bonding feature 15 and/or the second conductive bonding feature 25 may be subjected to a gas plasma treatment with a source gas, such as ammonia ($NH_3$), nitrous oxide ($N_2O$) or nitric oxide (NO), so as to obtain the $Cu_xN$ layer. Other suitable plasma gases are within the contemplated scope of the present disclosure. The gas plasma treatment may enable nitrogen atoms to be filled in gaps among copper grains of the upper portion(s) of the first conductive bonding feature 15 and/or the second conductive bonding feature 25 so as to form $Cu_xN$ in the gaps, and may also enable formation of $Cu_xN$ on the surface(s) of the upper portion(s), which is conducive to reducing formation of voids and stabilizing a distribution of the copper atoms at the interface between the first and second conductive bonding features 15, 25. In alternative embodiments, the upper portion(s) of the first conductive bonding feature 15 and/or the second conductive bonding feature 25 may be subjected to a nitrogen implanting treatment, so as to obtain the $Cu_xN$ layer. In some embodiments, the $Cu_xN$ layer may have a nitrogen concentration greater than about $10^{-6}$ ppb, such as greater than about 10 ppb. In some embodiments, the $Cu_xN$ layer may have a nitrogen concentration that exhibits a decreasing trend in a direction from an upper surface of the first conductive bonding feature 15 exposed from the first dielectric bonding layer 13 to a lower surface of the first conductive bonding feature 15 opposite to the upper surface. For example, the nitrogen concentration of the first conductive bonding feature 15 at a depth of about 0.1 μm (measured from the upper surface of the first conductive bonding feature 15) is greater than that at a depth of about 3 μm (measured from the upper surface of the first conductive bonding feature 15). Likewise, the nitrogen concentration of the $Cu_xN$ layer may exhibit a decreasing trend in a direction from an upper surface of the second conductive bonding feature 25 exposed from the second dielectric bonding layer 24 to a lower surface of the second conductive bonding feature 25 opposite to the upper surface.

In some embodiments, the non-metal dopant is carbon, and the protective layer 32 may be a carbon-containing metal layer. In some embodiments, the protective layer 32 may be a carbon-containing copper layer. In some embodiments, the upper portion(s) of the first conductive bonding feature 15 and/or the second conductive bonding feature 25 may be subjected to a carbon implanting treatment, so as to obtain the carbon-containing metal layer (for example, the carbon-containing copper layer). In this case, a plurality of carbon atoms may be present on the surface(s) of the upper portion(s) of the first conductive bonding feature 15 and/or the second conductive bonding feature 25, and may also diffuse into the upper portion(s) of the first conductive bonding feature 15 and/or the second conductive bonding feature 25 so as to be present among the metal grains (for example, copper grains) of the upper portion(s) of the first conductive bonding feature 15 and/or the second conductive bonding feature 25 for forming the carbon-containing metal layer (for example, the carbon-containing copper layer). In some embodiments, the carbon containing metal layer may have a carbon concentration that exhibits a decreasing trend in a direction from an upper surface of the first conductive bonding feature 15 exposed from the first dielectric bonding layer 13 to a lower surface of the first conductive bonding feature 15 opposite to the upper surface. For example, the carbon concentration of the first conductive bonding feature 15 at the depth of about 0.1 μm (measured from the upper surface of the first conductive bonding feature 15) is greater than that at the depth of about 3 μm (measured from the upper surface of the first conductive bonding feature 15). Likewise, the carbon concentration of the carbon-containing metal layer may exhibit a decreasing trend in a direction from an upper surface of the second conductive bonding feature 25 exposed from the second dielectric bonding layer 24 to a lower surface of the second conductive bonding feature 25 opposite to the upper surface.

Figure 10:
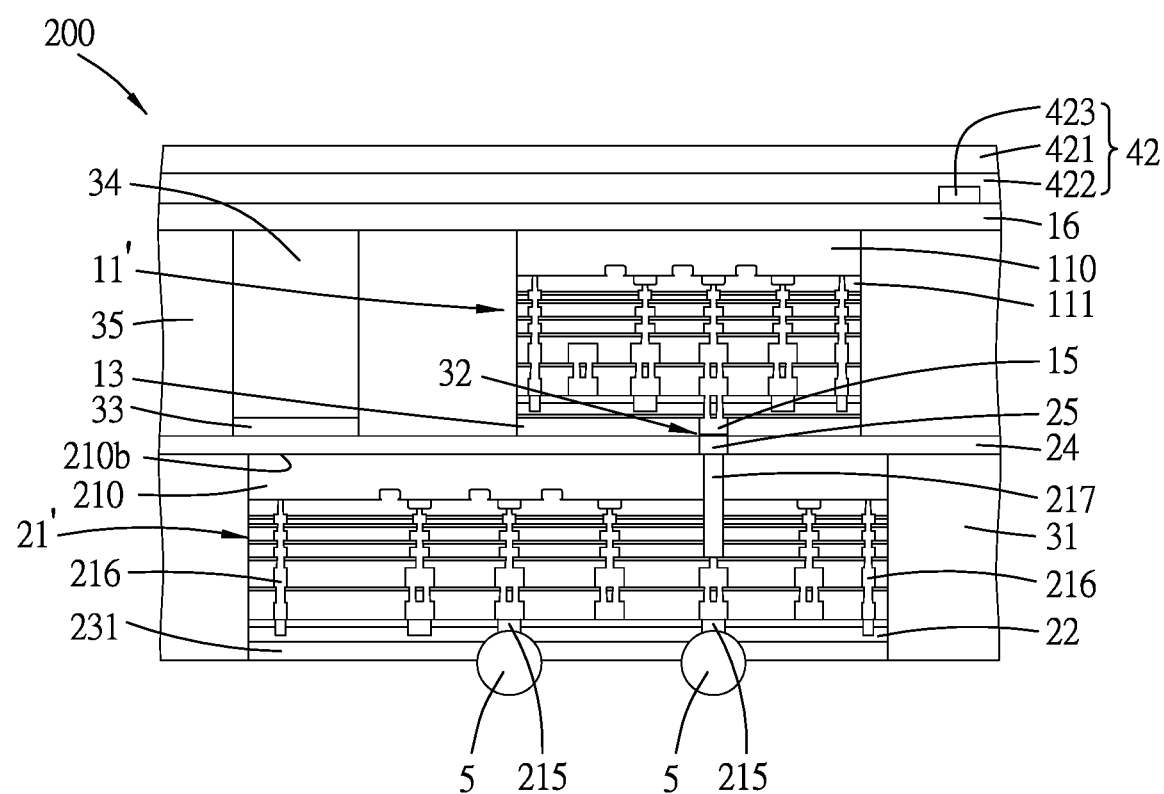

In sub-step 1035, the first and second semiconductor structures 11', 21' are bonded together through a hybrid bonding process, so that the second dielectric bonding layer 24 is bonded to the first dielectric bonding layer 13, and the second conductive bonding feature 25 is bonded to the first conductive bonding feature 15 to form the interface therebetween. The protective layer(s) 32 is/are disposed at the interface between the first and second conductive bonding features 15, 25. By having the protective layer(s) 32 disposed at the interface between the first and second conductive bonding features 15, 25, metal migration (such as, copper migration) may be mitigated when a current passes through the interface therebetween (e.g., when the semiconductor package device 200 shown in FIG. 10 is subjected to a reliability test).

In some embodiments, the non-metal dopant introduced into the first conductive bonding feature 15, the second conductive bonding feature 25, or a combination thereof includes a plurality of carbon atoms distributed throughout the first conductive bonding feature 15, the second conductive bonding feature 25, or a combination thereof. The carbon atoms may be used to slow down a moving speed of the metal atoms (for example, the copper atoms) at the interface between the first and second conductive bonding features 15, 25 due to its relatively higher resistivity (i.e., ranging from about $5.0 \times 10^{-4}$ Ωm to about $8.0 \times 10^{-4}$ Ωm), thereby reducing the formation of voids and metal migration (for example, copper migration) at the interface between the first and second conductive bonding features 15, 25. In some embodiments, the carbon atoms may be introduced into the first conductive bonding feature 15 and/or the second conductive bonding feature 25 by an implanting process. In some alternative embodiments, the carbon atoms may be introduced into the first conductive bonding feature 15 and/or the second conductive bonding feature 25 using a chemical agent. The chemical agent is added into an electrochemical plating (ECP) solution (e.g., a copper sulphate ($CuSO_4$) solution), which is used for forming the first conductive bonding feature 15 and/or the second conductive bonding feature 25, so that the first conductive bonding feature 15 and/or the second conductive bonding feature 25 thus formed include(s) the carbon atoms distributed throughout the first conductive bonding feature 15 and/or the second conductive bonding feature 25. In this case, the chemical agent includes a suppressor and an accelerator. The suppressor may include a long-chain polymer that may serve as a blocking layer and that may adhere to surfaces of the copper atoms in the ECP solution. The suppressor may include, for example, but not limited to, polyethylene glycol (PEG) ($H((CH_2)_xO)_yOH$) or PEG chloride. Other suitable materials for the suppressor are within the contemplated scope of the present disclosure. The accelerator may include, for example, but not limited to, bis(3-sulfopropyl) disulfide (SPS) ($Na_2(S(CH_2)_3)SO_3)_2$. Other suitable materials for the accelerator are within the contemplated scope of the present disclosure. In some embodiments, in the chemical agent, the suppressor may have a concentration (e.g., greater than about 0.5 mL/L) about five times greater than that of the accelerator (e.g., greater than about 0.1 mL/L). In some embodiments, the first conductive bonding feature 15 and/or the second conductive bonding feature 25 may have a carbon concentration greater than about $10^{-8}$ ppb, such as greater than about 1 ppb.

Figure 8:
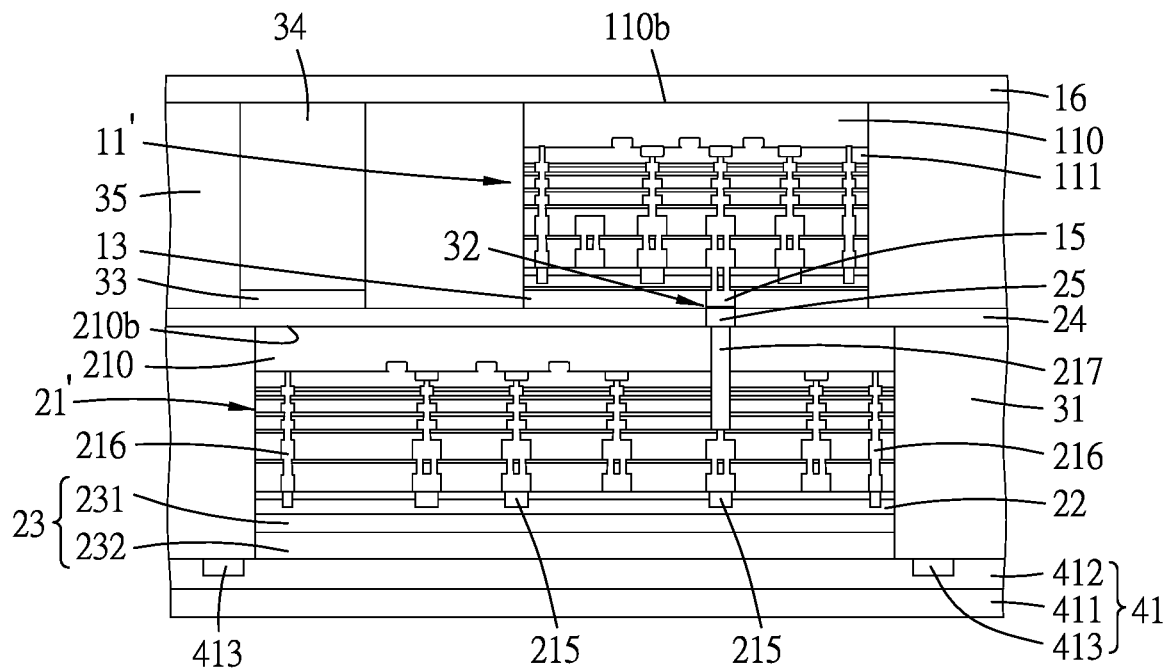

Referring to FIG. 1 and the example illustrated in FIG. 8, the method 100 then proceeds to step 104, where an optional dummy bonding layer 33, an optional dummy element 34, a fourth dielectric layer 35 and a connecting layer 16 are sequentially formed on the structure shown in FIG. 7. The optional dummy bonding layer 33 is formed on the second dielectric bonding layer 24, and is spaced apart from the first dielectric bonding layer 13. The optional dummy bonding layer 33 may be made of silicon oxide ($SiO_2$). The optional dummy element 34 is formed on the optional dummy bonding layer 33. In some embodiments, the optional dummy element 34 is spaced apart from the first semiconductor structure 11'. The optional dummy element 34 may be made of silicon (Si), and may have a heat dissipating capability to prevent other structures (e.g., the first semiconductor structure 11' and/or the second semiconductor structure 21') from being damaged during formation of the fourth dielectric layer 35 (e.g., formed by a chemical vapor deposition (CVD) process). In addition, the optional dummy element 34 may provide a support for formation of the connecting layer 16, so that the connecting layer 16 may have a good uniformity. In some embodiments, the optional dummy element 34 may be a dummy die. The material for the fourth dielectric layer 35 may be the same as or similar to that for the first dielectric layer 12, and thus, details thereof are omitted for the sake of brevity. The connecting layer 16 is formed on the fourth dielectric layer 35 and the optional dummy element 34. The material for the connecting layer 16 may be the same as or similar to that for the connecting layer 23, and thus details thereof are omitted for the sake of brevity. In some embodiments, during the hybrid bonding process (i.e., step 103) or the formation of the fourth dielectric layer 35, the first conductive bonding feature 15 or the second conductive bonding feature 25 may be heated, resulting in a copper hillock (not shown) that may be formed on the upper surface of the first conductive bonding feature 15 or the second conductive bonding feature 25 and that may be covered by the protective layer 32 (e.g., the $Cu_xO$ layer, the $Cu_xN$ layer, or the carbon-containing metal layer). Therefore, metal migration (such as, copper migration) at the interface between the first and second conductive bonding features 15, 25 may be mitigated when a current passes through the interface therebetween. In some embodiments, after the formation of the fourth dielectric layer 35, a planarization process (e.g., CMP or other suitable planarization processes) may be performed to remove an excess portion of the fourth dielectric layer 35 until a lower surface 110b of the first semiconductor substrate 110 is exposed.

Figure 9:
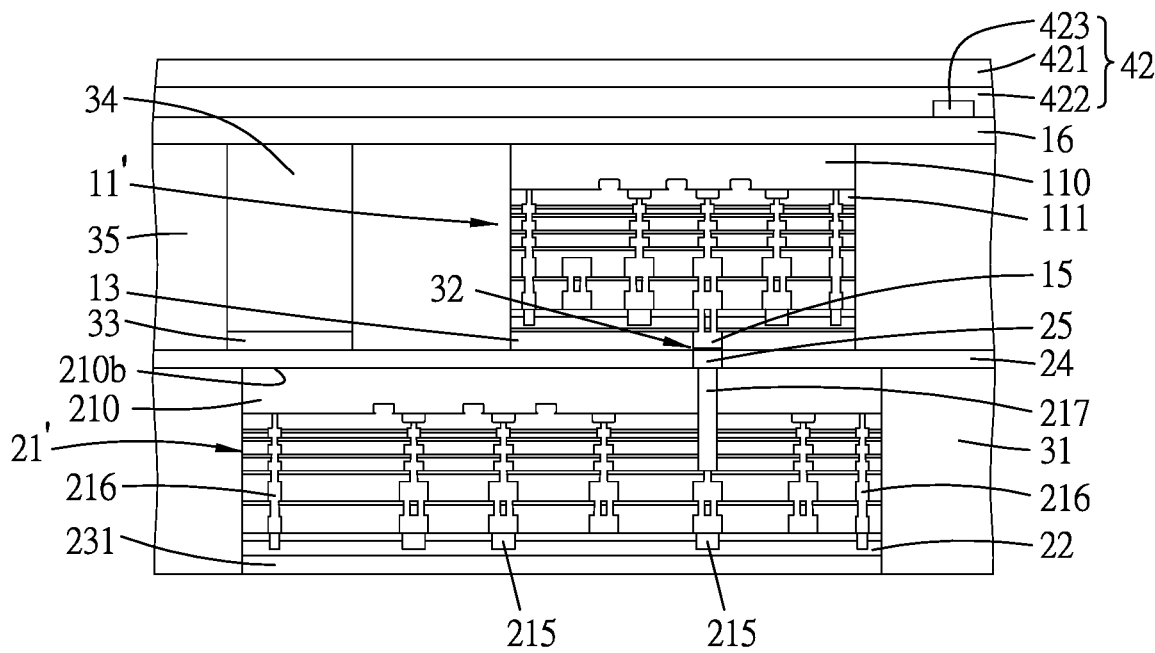

Referring to FIG. 1 and the example illustrated in FIG. 9, the method 100 then proceeds to step 105, where a second carrier wafer 42 is connected to the connecting layer 16 of the structure shown in FIG. 8, followed by removing the first carrier wafer 41 and the second part 232 of the connecting layer 23. The second carrier wafer 42 is generally similar to the first carrier wafer 41, and may include a second base 421, a second fusion bonding layer 422 and a plurality of second alignment marks 423. The second alignment marks 423 are disposed in the second fusion bonding layer 422, and are spaced apart from each other. The respective materials for the second base 421, the second fusion bonding layer 422, and the second alignment marks 423 may be the same as or similar to those for the first base 411, the first fusion bonding layer 412, and the first alignment marks 413, and thus, details thereof are omitted for the sake of brevity. The first carrier wafer 41 and the second part 232 of the connecting layer 23 may be removed by a planarization process (e.g., CMP or other suitable planarization processes) or an etching process.

Referring to FIG. 1 and the example illustrated in FIG. 10, the method 100 then proceeds to step 106, where a plurality of bumps 5 are formed. Step 106 may include sub-step (i) patterning the first part 231 of the connecting layer 23 by a photolithography process, so as to form a plurality of openings (not shown), and sub-step (ii) forming the bumps 5 in the openings, respectively. The bumps 5 may be made of tin (Sn). In some embodiments, the bumps 5 may be C4 bumps or micro bumps. Each of the bumps 5 is in contact with a corresponding one of the second pads 215. After step 106, the semiconductor package device 200 is therefore obtained.

In this disclosure, by forming a protective layer at an interface between a first conductive bonding feature of a first semiconductor structure and a second conductive bonding feature of a second semiconductor structure, or by introducing a plurality of carbon atoms (serving as a non-metal dopant) into at least one of the first and second conductive bonding features, metal migration (for example, copper electromigration) and formation of voids may be mitigated at the interface between the first and second conductive bonding features. As such, a semiconductor package device including the first and second semiconductor structures that are bonded together may have an enhanced reliability. The protective layer may be a metal oxide layer (for example, a copper oxide ($Cu_xO$) layer), a metal nitride layer (for example, a copper nitride ($Cu_xN$) layer), or a carbon-containing metal layer.

In accordance with some embodiments of the present disclosure, a semiconductor package device includes: a first semiconductor structure, a second semiconductor structure, and a non-metal dopant. The first semiconductor structure includes a first dielectric bonding layer and a first conductive bonding feature disposed in the first dielectric bonding layer. The second semiconductor structure includes a second dielectric bonding layer bonded to the first dielectric bonding layer and a second conductive bonding feature disposed in the second dielectric bonding layer. The first conductive bonding feature is bonded to the second conductive bonding feature to form an interface therebetween. The non-metal dopant is disposed in at least one of the first conductive bonding feature and the second conductive bonding feature.

In accordance with some embodiments of the present disclosure, the non-metal dopant is oxygen, and a portion of the at least one of the first conductive bonding feature and the second conductive bonding feature is a metal oxide layer disposed at the interface therebetween. The metal oxide layer has an oxygen concentration greater than $10^{-6}$ ppb In accordance with some embodiments of the present disclosure, the non-metal dopant is nitrogen, and a portion of the at least one of the first conductive bonding feature and the second conductive bonding feature is a metal nitride layer disposed at the interface therebetween. The metal nitride layer has a nitrogen concentration greater than $10^{-6}$ ppb.

In accordance with some embodiments of the present disclosure, the non-metal dopant is carbon, and a portion of the at least one of the first conductive bonding feature and the second conductive bonding feature is a carbon-containing metal layer disposed at the interface therebetween. The carbon-containing metal layer has a carbon concentration that exhibits a decreasing trend in a direction from the interface to a lower surface of the at least one of the first conductive bonding feature and the second conductive bonding feature opposite to the interface.

In accordance with some embodiments of the present disclosure, the non-metal dopant is carbon, which is distributed throughout the at least one of the first conductive bonding feature and the second conductive bonding feature. The non-metal dopant has a carbon concentration of greater than $10^{-8}$ ppb.

In accordance with some embodiments of the present disclosure, a method for manufacturing a semiconductor package device includes: forming a first semiconductor structure and a second semiconductor structure, the first semiconductor structure including a first dielectric bonding layer and a first conductive bonding feature disposed in the first dielectric bonding layer, the second semiconductor structure including a second dielectric bonding layer and a second conductive bonding feature disposed in the second dielectric bonding layer; introducing a non-metal dopant into at least one of the first conductive bonding feature and the second conductive bonding feature; bonding the first dielectric bonding layer to the second dielectric bonding layer; and bonding the first conductive bonding feature to the second conductive bonding feature to form an interface therebetween.

In accordance with some embodiments of the present disclosure, the non-metal dopant is oxygen and is introduced into the at least one of the first conductive bonding feature and the second conductive bonding feature by at least one of: exposing the at least one of the first conductive bonding feature and the second conductive bonding feature in an oxygen-containing environment; subjecting the at least one of the first conductive bonding feature and the second conductive bonding feature to a gas plasma treatment using an oxygen source gas; subjecting the at least one of the first conductive bonding feature and the second conductive bonding feature to a thermal oxidation treatment using an oxygen source gas; and subjecting the at least one of the first conductive bonding feature and the second conductive bonding feature to an oxygen implanting treatment, so as to form a metal oxide layer at the interface therebetween.

In accordance with some embodiments of the present disclosure, the non-metal dopant is nitrogen and is introduced into the at least one of the first conductive bonding feature and the second conductive bonding feature by at least one of: subjecting the at least one of the first conductive bonding feature and the second conductive bonding feature to a gas plasma treatment using a nitrogen source gas; and subjecting the at least one of the first conductive bonding feature and the second conductive bonding feature to a nitrogen implanting treatment, so as to form a metal nitride layer at the interface therebetween.

In accordance with some embodiments of the present disclosure, the non-metal dopant is carbon and is introduced into the at least one of the first conductive bonding feature and the second conductive bonding feature by subjecting the at least one of the first conductive bonding feature and the second conductive bonding feature to a carbon implanting treatment so as to form a carbon-containing metal layer at the interface therebetween.

In accordance with some embodiments of the present disclosure, the non-metal dopant is carbon and is introduced into the at least one of the first conductive bonding feature and the second conductive bonding feature by subjecting the at least one of the first conductive bonding feature and the second conductive bonding feature to a carbon implanting treatment so as to permit the non-metal dopant to be distributed throughout the at least one of the first conductive bonding feature and the second conductive bonding feature.

In accordance with some embodiments of the present disclosure, the non-metal dopant is carbon and is introduced into the at least one of the first conductive bonding feature and the second conductive bonding feature using a chemical agent and an electrochemical plating solution so as to form the first conductive bonding feature and the second conductive bonding feature and to permit the non-metal dopant to be distributed throughout the at least one of the first conductive bonding feature and the second conductive bonding feature.

In accordance with some embodiments of the present disclosure, the chemical agent includes a suppressor which includes polyethylene glycol, polyethylene glycol chloride, or a combination thereof, and an accelerator which includes bis(3-sulfopropyl) disulfide.

In accordance with some embodiments of the present disclosure, the suppressor has a concentration five times greater than that of the accelerator.

In accordance with some embodiments of the present disclosure, the concentration of the suppressor is greater than 0.5 mL/L and the concentration of the accelerator is greater than 0.1 mL/L.

In accordance with some embodiments of the present disclosure, a method for manufacturing a semiconductor package device includes: forming a first semiconductor structure including a first dielectric bonding layer and a first conductive bonding feature disposed in the first dielectric bonding layer; forming a second semiconductor structure including a second dielectric bonding layer and a second conductive bonding feature disposed in the second dielectric bonding layer; introducing a non-metal dopant into at least one of the first conductive bonding feature and the second conductive bonding feature; and bonding the first semiconductor structure to the second semiconductor structure by a hybrid bonding process so as to permit the first dielectric bonding layer to be bonded to the second dielectric bonding layer and to permit the first conductive bonding feature to be bonded to the second conductive bonding feature, such that an interface is formed between the first conductive bonding feature and the second conductive bonding feature.

In accordance with some embodiments of the present disclosure, the non-metal dopant is oxygen and is introduced into the at least one of the first conductive bonding feature and the second conductive bonding feature by at least one of: exposing the at least one of the first conductive bonding feature and the second conductive bonding feature in an oxygen-containing environment; subjecting the at least one of the first conductive bonding feature and the second conductive bonding feature to a gas plasma treatment using an oxygen source gas; subjecting the at least one of the first conductive bonding feature and the second conductive bonding feature to a thermal oxidation treatment using an oxygen source gas; and subjecting the at least one of the first conductive bonding feature and the second conductive bonding feature to an oxygen implanting treatment, so as to form a metal oxide layer at the interface therebetween.

In accordance with some embodiments of the present disclosure, the non-metal dopant is nitrogen and is introduced into the at least one of the first conductive bonding feature and the second conductive bonding feature by at least one of: subjecting the at least one of the first conductive bonding feature and the second conductive bonding feature to a gas plasma treatment using a nitrogen source gas; and subjecting the at least one of the first conductive bonding feature and the second conductive bonding feature to a nitrogen implanting treatment, so as to form a metal nitride layer at the interface therebetween.

In accordance with some embodiments of the present disclosure, the non-metal dopant is carbon and is introduced into the at least one of the first conductive bonding feature and the second conductive bonding feature by subjecting the at least one of the first conductive bonding feature and the second conductive bonding feature to a carbon implanting treatment so as to form a carbon-containing metal layer at the interface therebetween.

In accordance with some embodiments of the present disclosure, the non-metal dopant is carbon and is introduced into the at least one of the first conductive bonding feature and the second conductive bonding feature by subjecting the at least one of the first conductive bonding feature and the second conductive bonding feature to a carbon implanting treatment so as to permit the non-metal dopant to be distributed throughout the at least one of the first conductive bonding feature and the second conductive bonding feature.

In accordance with some embodiments of the present disclosure, the non-metal dopant is carbon and is introduced into the at least one of the first conductive bonding feature and the second conductive bonding feature using a chemical agent and an electrochemical plating solution so as to form the first conductive bonding feature and the second conductive bonding feature and to permit the non-metal dopant to be distributed throughout the at least one of the first conductive bonding feature and the second conductive bonding feature.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package device, comprising:
a first semiconductor structure and a second semiconductor structure, the first semiconductor structure including a first dielectric bonding layer and a first conductive bonding feature disposed in the first dielectric bonding layer, the second semiconductor structure including a second dielectric bonding layer bonded to the first dielectric bonding layer and a second conductive bonding feature disposed in the second dielectric bonding layer, the first conductive bonding feature being bonded to the second conductive bonding feature to form an interface therebetween; and
a non-metal dopant disposed in at least one of the first conductive bonding feature and the second conductive bonding feature.

2. The semiconductor package device as claimed in claim 1, wherein the non-metal dopant is oxygen, and a portion of the at least one of the first conductive bonding feature and the second conductive bonding feature is a metal oxide layer disposed at the interface therebetween, the metal oxide layer having an oxygen concentration greater than $10^{-6}$ ppb.

3. The semiconductor package device as claimed in claim 1, wherein the non-metal dopant is nitrogen, and a portion of the at least one of the first conductive bonding feature and the second conductive bonding feature is a metal nitride layer disposed at the interface therebetween, the metal nitride layer having a nitrogen concentration greater than $10^{-6}$ ppb.

4. The semiconductor package device as claimed in claim 1, wherein the non-metal dopant is carbon, and a portion of the at least one of the first conductive bonding feature and the second conductive bonding feature is a carbon-containing metal layer disposed at the interface therebetween, the carbon-containing metal layer having a carbon concentration that exhibits a decreasing trend in a direction from the interface to a lower surface of the at least one of the first conductive bonding feature and the second conductive bonding feature opposite to the interface.

5. The semiconductor package device as claimed in claim 1, wherein the non-metal dopant is carbon, which is distributed throughout the at least one of the first conductive bonding feature and the second conductive bonding feature, the non-metal dopant having a carbon concentration of greater than $10^{-8}$ ppb.

6. A method for manufacturing a semiconductor package device, comprising:
forming a first semiconductor structure and a second semiconductor structure, the first semiconductor structure including a first dielectric bonding layer and a first conductive bonding feature disposed in the first dielectric bonding layer, the second semiconductor structure including a second dielectric bonding layer and a second conductive bonding feature disposed in the second dielectric bonding layer;
introducing a non-metal dopant into at least one of the first conductive bonding feature and the second conductive bonding feature;
bonding the first dielectric bonding layer to the second dielectric bonding layer; and
bonding the first conductive bonding feature to the second conductive bonding feature to form an interface therebetween.

7. The method as claimed in claim 6, wherein the non-metal dopant is oxygen and is introduced into the at least one of the first conductive bonding feature and the second conductive bonding feature by at least one of:
exposing the at least one of the first conductive bonding feature and the second conductive bonding feature in an oxygen-containing environment;
subjecting the at least one of the first conductive bonding feature and the second conductive bonding feature to a gas plasma treatment using an oxygen source gas;
subjecting the at least one of the first conductive bonding feature and the second conductive bonding feature to a thermal oxidation treatment using an oxygen source gas; and
subjecting the at least one of the first conductive bonding feature and the second conductive bonding feature to an oxygen implanting treatment,
so as to form a metal oxide layer at the interface therebetween.

8. The method as claimed in claim 6, wherein the non-metal dopant is nitrogen and is introduced into the at least one of the first conductive bonding feature and the second conductive bonding feature by at least one of:
subjecting the at least one of the first conductive bonding feature and the second conductive bonding feature to a gas plasma treatment using a nitrogen source gas; and
subjecting the at least one of the first conductive bonding feature and the second conductive bonding feature to a nitrogen implanting treatment, so as to form a metal nitride layer at the interface therebetween.

9. The method as claimed in claim 6, wherein the non-metal dopant is carbon and is introduced into the at least one of the first conductive bonding feature and the second conductive bonding feature by subjecting the at least one of the first conductive bonding feature and the second conductive bonding feature to a carbon implanting treatment so as to form a carbon-containing metal layer at the interface therebetween.

10. The method as claimed in claim 6, wherein the non-metal dopant is carbon and is introduced into the at least one of the first conductive bonding feature and the second conductive bonding feature by subjecting the at least one of the first conductive bonding feature and the second conductive bonding feature to a carbon implanting treatment so as to permit the non-metal dopant to be distributed throughout the at least one of the first conductive bonding feature and the second conductive bonding feature.

11. The method as claimed in claim 6, wherein the non-metal dopant is carbon and is introduced into the at least one of the first conductive bonding feature and the second conductive bonding feature using a chemical agent and an electrochemical plating solution so as to form the first conductive bonding feature and the second conductive bonding feature and to permit the non-metal dopant to be distributed throughout the at least one of the first conductive bonding feature and the second conductive bonding feature.

12. The method as claimed in claim 11, wherein the chemical agent includes a suppressor which includes polyethylene glycol, polyethylene glycol chloride, or a combination thereof, and an accelerator which includes bis(3-sulfopropyl) disulfide.

13. The method as claimed in claim 12, wherein the suppressor has a concentration five times greater than that of the accelerator.

14. The method as claimed in claim 13, wherein the concentration of the suppressor is greater than 0.5 mL/L and the concentration of the accelerator is greater than 0.1 mL/L.

15. A method for manufacturing a semiconductor package device, comprising:
forming a first semiconductor structure including a first dielectric bonding layer and a first conductive bonding feature disposed in the first dielectric bonding layer;
forming a second semiconductor structure including a second dielectric bonding layer and a second conductive bonding feature disposed in the second dielectric bonding layer;
introducing a non-metal dopant into at least one of the first conductive bonding feature and the second conductive bonding feature; and
bonding the first semiconductor structure to the second semiconductor structure by a hybrid bonding process so as to permit the first dielectric bonding layer to be bonded to the second dielectric bonding layer and to permit the first conductive bonding feature to be bonded to the second conductive bonding feature, such that an interface is formed between the first conductive bonding feature and the second conductive bonding feature.

16. The method as claimed in claim 15, wherein the non-metal dopant is oxygen and is introduced into the at least one of the first conductive bonding feature and the second conductive bonding feature by at least one of:
exposing the at least one of the first conductive bonding feature and the second conductive bonding feature in an oxygen-containing environment;
subjecting the at least one of the first conductive bonding feature and the second conductive bonding feature to a gas plasma treatment using an oxygen source gas;
subjecting the at least one of the first conductive bonding feature and the second conductive bonding feature to a thermal oxidation treatment using an oxygen source gas; and
subjecting the at least one of the first conductive bonding feature and the second conductive bonding feature to an oxygen implanting treatment,
so as to form a metal oxide layer at the interface therebetween.

17. The method as claimed in claim 15, wherein the non-metal dopant is nitrogen and is introduced into the at least one of the first conductive bonding feature and the second conductive bonding feature by at least one of:
subjecting the at least one of the first conductive bonding feature and the second conductive bonding feature to a gas plasma treatment using a nitrogen source gas; and
subjecting the at least one of the first conductive bonding feature and the second conductive bonding feature to a nitrogen implanting treatment,
so as to form a metal nitride layer at the interface therebetween.

18. The method as claimed in claim 15, wherein the non-metal dopant is carbon and is introduced into the at least one of the first conductive bonding feature and the second conductive bonding feature by subjecting the at least one of the first conductive bonding feature and the second conductive bonding feature to a carbon implanting treatment so as to form a carbon-containing metal layer at the interface therebetween.

19. The method as claimed in claim 15, wherein the non-metal dopant is carbon and is introduced into the at least one of the first conductive bonding feature and the second conductive bonding feature by subjecting the at least one of the first conductive bonding feature and the second conductive bonding feature to a carbon implanting treatment so as to permit the non-metal dopant to be distributed throughout the at least one of the first conductive bonding feature and the second conductive bonding feature.

20. The method as claimed in claim 15, wherein the non-metal dopant is carbon and is introduced into the at least one of the first conductive bonding feature and the second conductive bonding feature using a chemical agent and an electrochemical plating solution so as to form the first conductive bonding feature and the second conductive bonding feature and to permit the non-metal dopant to be distributed throughout the at least one of the first conductive bonding feature and the second conductive bonding feature.

* * * * *